United States Patent
Majka et al.

Patent Number: 6,005,394
Date of Patent: Dec. 21, 1999

[54] PROCESS AND APPARATUS FOR THE CAPACITIVE TESTING OF PRINTED CIRCUITS

[75] Inventors: Christopher J. Majka, Endicott; Matthew F. Seward, Windsor, both of N.Y.

[73] Assignee: International Business Machines Corporation, Armonk, N.Y.

[21] Appl. No.: 09/009,367

[22] Filed: Jan. 20, 1998

[51] Int. Cl.⁶ ..................................... G01R 31/02
[52] U.S. Cl. .......................... 324/519; 324/537; 324/754
[58] Field of Search .................... 324/519, 537, 324/555, 754, 765, 525, 538, 158.1, 73.1

[56] References Cited

U.S. PATENT DOCUMENTS

| | | | |
|---|---|---|---|
| 3,975,680 | 8/1976 | Webb ...................................... | 324/519 |
| 4,565,966 | 1/1986 | Burr et al. .............................. | 324/537 |
| 5,006,808 | 4/1991 | Watts ..................................... | 324/537 |
| 5,256,975 | 10/1993 | Mellitz et al. .......................... | 324/519 |
| 5,363,048 | 11/1994 | Modlin et al. .......................... | 324/519 |
| 5,391,993 | 2/1995 | Khazam et al. ........................ | 324/519 |
| 5,744,964 | 4/1998 | Sudo et al. ............................. | 324/537 |

OTHER PUBLICATIONS

IBM Technical Disclosure Bulletin vol. 39, No. 09, (Sep. 1996), p. 111.
IBM Technical Disclosure Bulletin vol. 38, No. 06, (Jun. 1995), pp. 549,550.
IBM Technical Disclosure Bulletin vol. 38, No. 06, (Jun. 1995), pp. 507–508.
IBM Technical Disclosure Bulletin vol. 28, No. 7, (Dec. 1985), pp. 2849–2851.

*Primary Examiner*—Diep N. Do
*Attorney, Agent, or Firm*—Ratner & Prestia; John R. Pivnichny

[57] ABSTRACT

The accuracy of a capacitive testing procedure is improved by adjusting the ideal values against which comparisons are made during the testing process, for all of the circuit elements (e.g., pin connections) being tested, responsive to cumulative deviations of the measured values from their anticipated ideal values. This can be accomplished by initially comparing all of the capacitance measurements taken for a given printed circuit to their ideal values, and calculating a deviation for each of the comparisons made. Following the testing of an entire printed circuit, the resulting series of calculated deviations are tabulated and averaged, and the resulting average deviation is then added to or subtracted from the tabulated readings for each of the circuit elements before any true defects are identified for the printed circuit being tested. In this way, all of the parts being tested are brought to the same baseline, eliminating overall reference differences (i.e., between different panels).

30 Claims, 1 Drawing Sheet

PROCESS AND APPARATUS FOR THE CAPACITIVE TESTING OF PRINTED CIRCUITS

TECHNICAL FIELD

The present invention is generally directed to the manufacture of printed circuits and, in particular, to the capacitive testing of such circuits for purposes of identifying open and shorted circuit elements.

BACKGROUND OF THE INVENTION

Following manufacture, it is common practice to subject a printed circuit to testing appropriate toward ensuring that the resulting article has been correctly manufactured and is effectively operating within its specified parameters. One such test involves the capacitive measurement of printed circuit products to determine whether or not elements of the printed circuit (e.g., the networks, or nets, of the printed circuit) are open or shorted.

In general, this process involves measuring the capacitance of a circuit element relative to either an external reference plane or an internal power plane, and comparing the measured value to a previously determined (i.e., learned) "ideal" value. If the difference between the two numbers is found to be within a certain limit, the circuit element is deemed acceptable, and steps are then taken to test other circuit elements of the printed circuit. If the measured value is found to be higher than the ideal value, the circuit element is deemed to be connected to another circuit element, and a short circuit is determined to be present. If the measured value is found to be lower than the ideal value, the circuit element is deemed to include an open circuit.

Such capacitance testing is primarily performed by measuring how much copper (surface area) is present for each circuit element being tested. All of tee circuit elements present on a particular printed circuit are tested sequentially. Each measured value is compared, in turn, to the corresponding ideal value for that circuit element (previously established) to determine it there are failures, and which of the circuit elements are defective.

Although such testing methods are generally satisfactory, it has been found that the results can be less than satisfactory in situations where circuit elements of the printed circuit being tested differ, even slightly, from the "ideal" printed circuit. These situations can include circuit elements which would be satisfactory in terms of their electrical characteristics, and which would operate acceptably in practice but which, due to over-etching or under-etching during manufacture of the printed circuit, produce a capacitance measurement (i.e., a capacitive signature) which is slightly higher for under-etched parts and slightly lower for over-etched parts. Moreover, the repeatability of line widths will vary from job-to-job, causing still other problems during the testing procedure. Such part-to-part differences can become even more troublesome as the line geometries (i.e., dimensions) shrink.

As an example, in testing circuit elements which would typically exhibit a capacitance of less than 3 pf, such as in chip carriers and the like, tolerances on the order of ±20% are used as the threshold for identifying defects present on the printed circuit. At these levels, differences in line width resulting from the initial manufacture of the printed circuit will be very significant. Such differences in line width can cause the test to fail an otherwise acceptable (good) part, and can also cause downtime of the testing apparatus until it can be determined whether the problem is the result of the manufacturing process or the testing apparatus.

Efforts have been made to address this problem. For example, it has been suggested ("Lead Frame Measurement Technique", IBM® Technical Disclosure Bulletin, Vol. 39, No. 09, September, 1996) to make capacitance measurements relative to each of a series of pin connections associated with a printed circuit, and to compare ratios of the measurements made at the several pins with pre-defined norms. U.S. Pat. No. 5,391,993 suggests averaging adjacent measurements to compensate for irregularities present on a particular part. Others have suggested various measures for adjusting the calculated "ideal" value against which subsequent comparisons are made, including adjustments made to the "tolerance window" which surrounds the ideal value. In practice, however, such efforts have not proven to be entirely satisfactory.

Therefore, the primary object of the present invention is to provide a more accurate way to measure capacitance values for purposes of testing the circuit elements of a printed circuit, or similar part. Another object of the present invention is to adjust for variations in the parts being tested, during the course of the capacitance-testing procedure, to compensate for process variations such as plating height, plating width, etch dissimilarities, dielectric variations, and relative humidity.

SUMMARY OF THE INVENTION

These and other objects which will become apparent are achieved in accordance with the present invention by taking steps to adjust the ideal values against which the comparisons are made during the course of the testing process, for all of the circuit elements (e.g., pin connections) being tested, responsive to cumulative deviations of the measured values from their anticipated ideal values.

In a preferred embodiment, this adjustment is accomplished by first comparing all of the capacitance measurements taken for a given printed circuit to their ideal values. Following this, and for each of the comparisons being made (i.e., for each of the circuit elements), a "percent deviation" is calculated. For the entire test (i.e., for the entire printed circuit), a series of percent deviations are calculated and tabulated for all circuit elements (i.e., for all nets). The tabulated percent deviations are then averaged, and the resulting "percent average deviation" is added to or subtracted from the tabulated readings for each of the circuit elements before any true defects are identified for the part being tested.

In this way, all of the parts being tested are brought to the same baseline, eliminating overall reference differences (i.e., between different panels). This has the advantage of eliminating false calls, retests, scrap, downtime of the test equipment, and system re-learning for slightly different jobs, in turn increasing the throughput of the test system.

BRIEF DESCRIPTION OF THE DRAWING

The invention is best understood from the following detailed description when read in connection with the accompanying drawing. Included in the drawing is the following FIGURE.

DETAILED DESCRIPTION OF A PREFERRED EMBODIMENT

Figure 1:
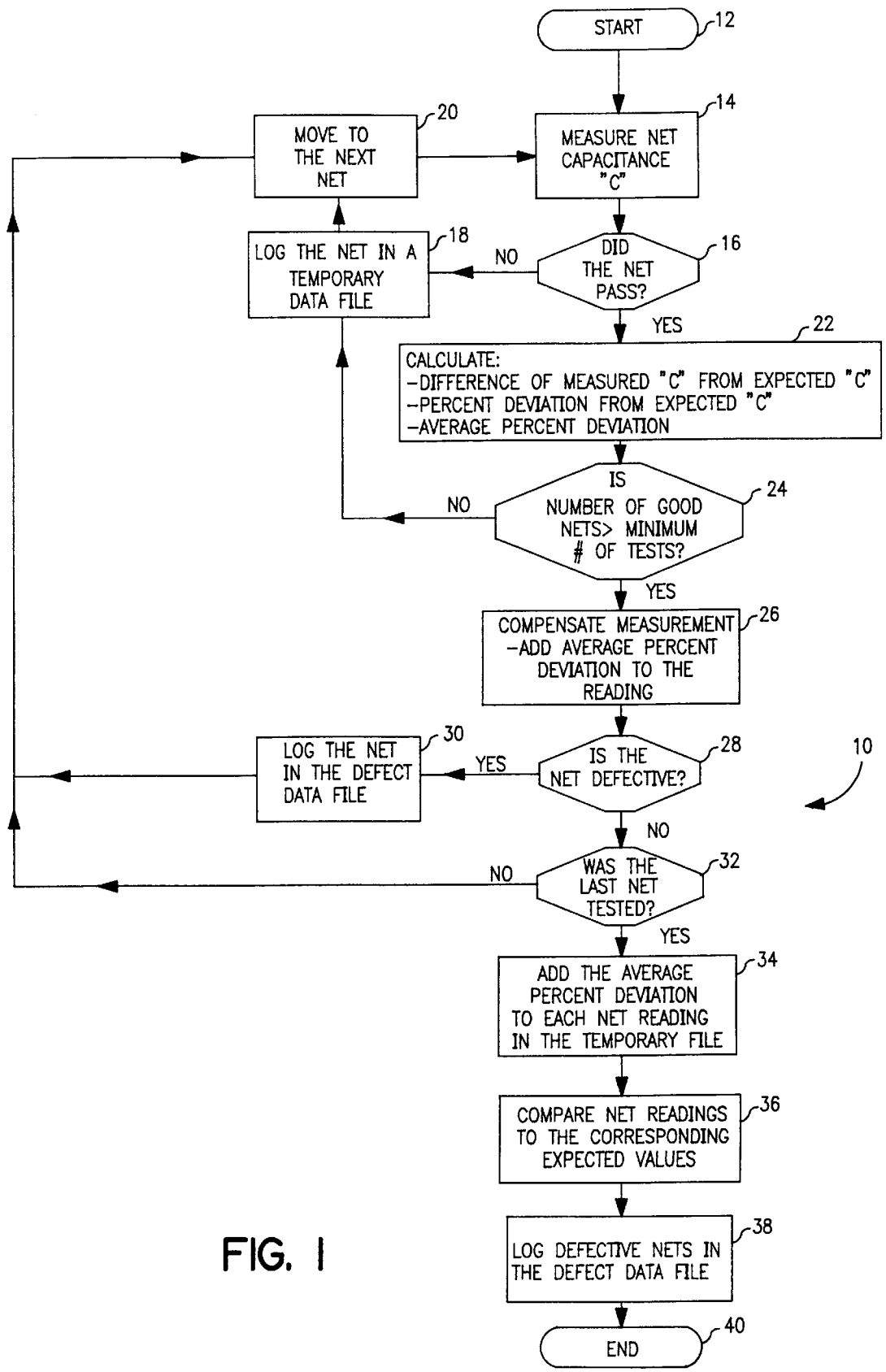
FIG. 1 is a flow chart showing a preferred system for implementing the improved testing procedure of the present invention.

FIG. 1 illustrates a preferred system 10 for implementing the improved capacitance-testing process of the present invention. After accessing the system 10, at 12, steps are initially taken to make whatever capacitance measurements ("C") are scheduled for the part (i.e., a printed circuit) being tested, at 14. It should be understood that the improvements of the present invention will be applicable to any of a variety of different part configurations, including any of a number of different printed circuit constructions and layouts, and that such capacitance measurements can be made using any of a variety of conventionally available capacitance-testing probes, test fixtures, and devices. In general, however, such measurements are performed by placing the probe of an appropriate tester on each of the net (circuit element) end points and making the usual capacitance measurement at each test point. The measured values, typically read in picofarads (pf), will generally range in values on the order of between 0.1 and 100 pf.

The measurements C taken at 14 are then individually tested, at 16. To this end, each measurement is compared with the ideal value which is expected for the corresponding circuit element of the part being tested. Again, any of a variety of known techniques may be used to establish, re-define, and adjust the ideal values for a particular part. Irrespective of such methods, the measured values should be within a specified range (i.e., tolerance) of the expected, ideal readings to be considered "good." For measured values lying outside of this range, the corresponding circuit element will be considered "bad."

In conjunction with the test at 16, a temporary data file is created, at 18. The temporary data file created at 18 for the part under test will at this point potentially contain both failing circuit elements as well as some good circuit elements. The temporary data file at 18 is loaded with such values until a sufficient number of good circuit elements are identified to be able to perform the calculations (i.e., an average percent deviation) to be discussed below.

Following this logging of data, at 18, steps are taken to test a subsequent circuit element via the return path 20. In this way, the next scheduled measurement (taken at 14) can be accessed and compared with its corresponding ideal value (responsive to the test at 16). Such routing will take place each time a bad circuit element is identified and logged in the temporary data file at 18.

If the test at 16 identifies a good circuit element, a series of calculations is made, at 22, based on the measured value C for that circuit element. In a first calculation, the measured value C is subtracted from the expected (ideal) value for C. In a second calculation, the percentage deviation of the measured value C from the expected value for C is found. In a third calculation, a "running average" of all calculated percent deviations (from their expected values) is kept.

Following these calculations, a test is made at 24 to determine whether a predetermined minimum number (a programmable parameter) of good circuit elements have been identified. This test is required to make sure that a reasonable percent deviation has to that point been calculated (at 22). Until such time as a sufficient number of good measurements have been identified, all measurements are entered in the temporary data file at 18. This step will again result in the potential for good circuit elements to be entered in the temporary data file at 18, which is used to collect failed data received from the test at 16. Compensation for such entries will be made, however, at a later stage.

After it is determined that the specified minimum number of good circuit elements has been identified, steps are taken at 26 to compensate the measurement for the circuit element then being tested to reflect the calculations made at 22. To this end, the average percent deviation calculated at 22 is added to the measured value (i.e., the present reading) for C. The resulting (compensated) value is then tested, at 28, to determine whether the compensated measured value falls within the range (i.e., the previously discussed tolerance surrounding the ideal value) established for identifying a good circuit element.

If the compensated measurement for the circuit element being tested is found to lie outside of its specified range, the circuit element is deemed to be bad and steps are taken to enter the bad circuit element in a defect file at 30 which is established for the printed circuit then being tested. Following this, steps are taken to proceed to the return path 20, so that subsequent circuit elements can be tested in similar fashion.

If the compensated measurement for the circuit element being tested is found to lie within its specified range, a test is made at 32 to determine whether the last of the series of circuit elements associated with a given printed circuit has been tested. If not, steps are again taken to proceed to the return path 20 so that the remaining circuit elements can be tested.

If it is determined (at 32) that the last in the series of circuit elements associated with a given printed circuit has been tested, steps are taken to perform additional calculations at 34. Primarily, the purpose of these calculations is to go back and compensate for the earlier circuit elements that were retained in the temporary data file at 18 as a result of the initial testing procedures for the printed circuit (i.e., before sufficient data were available for the above-described compensation to take place, at 26). To this end, the calculated average percent deviation is added to each of the measurements taken for the circuit elements then contained in the temporary data file at 18.

The compensated measurements are then compared with their corresponding ideal values, at 36, to determine whether the newly compensated measurements lie within their expected ranges. Circuit elements found to be bad are logged, at 38, in the defect data file at 30. As a result, the defect data file at 30 will then contain a listing of the bad circuit elements present on the printed circuit being tested. Any circuit elements found to be good are then passed, despite their earlier failure as part of the foregoing testing. This concludes the testing of a given printed circuit, at 40, whereupon steps can be taken to similarly test any subsequent printed circuits by repeating the foregoing procedures.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. In a process for identifying defective circuit elements present on a manufactured printed circuit by measuring a capacitance value for each of the circuit elements relative to a common reference point, and comparing each measured capacitance value to an ideal value defined for and corresponding to each of the circuit elements, the improvement which comprises the steps of:

determining a difference between the measured capacitance value and the ideal value for each of the circuit elements, yielding a plurality of differential values for the circuit elements; and averaging all of the differential values obtained for all of the circuit elements, yielding an average differential value for use in modifying the difference between the measured capacitance value and the ideal value.

2. The process of claim 1 wherein the circuit elements include a plurality of networks comprising the printed circuit.

3. The process of claim 1 wherein the capacitance value is measured relative to an external reference plane.

4. The process of claim 1 wherein the reference value is measured relative to an internal power plane.

5. The process of claim 1 wherein the ideal value is a learned value defined by measuring the capacitance values for the circuit elements of a plurality of printed circuits having circuit elements which are not defective.

6. The process of claim 1 wherein the difference between the measured capacitance value and the ideal value is a percentage deviation of the measured capacitance value from the ideal value.

7. The process of claim 1 which further includes the step of calculating the average differential value as a running average.

8. The process of claim 1 which further includes the steps of:
   identifying circuit elements wherein the measured capacitance value differs from the ideal value by an amount which exceeds a defined tolerance;
   modifying the difference between the measured capacitance value and the ideal value for each of the identified circuit elements with the average differential value; and
   comparing each modified difference with the ideal value for the corresponding circuit element, and determining whether the modified difference lies within the defined tolerance corresponding to a satisfactory circuit element.

9. The process of claim 8 which further includes the steps of identifying good circuit elements having modified differences which differ from the corresponding ideal values by no more than the defined tolerance, identifying bad circuit elements having modified differences which differ from the corresponding ideal values by more than the defined tolerance, and logging the bad circuit elements in a data file.

10. The process of claim 9 which further includes the steps of identifying good circuit elements having measured capacitance values which differ from the corresponding ideal values by no more than the defined tolerance, identifying bad circuit elements having measured capacitance values which differ from the corresponding ideal values by more than the defined tolerance, and logging the bad circuit elements in a temporary data file.

11. The process of claim 10 which further includes the step of counting the number of good circuit elements.

12. The process of claim 11 wherein the modifying step is performed only after the number of good circuit elements exceeds a defined threshold.

13. The process of claim 12 which further includes the steps of comparing the modified difference for a circuit element logged in the temporary data file with the ideal value for the corresponding circuit element, and determining whether the modified difference lies within the defined tolerance corresponding to a satisfactory circuit element after all of the circuit elements associated with the printed circuit have been tested.

14. A process for identifying defective circuit elements present on a manufactured printed circuit, comprising the steps of:
   measuring a capacitance value for each of the circuit elements relative to a common reference point;
   comparing each measured capacitance value to an ideal value defined for and corresponding to each of the circuit elements, and determining a difference between the measured capacitance value and the ideal value for each of the circuit elements, yielding a plurality of differential values for the circuit elements;
   averaging all of the differential values obtained for all of the circuit elements, yielding an average differential value;
   modifying the difference between the measured capacitance value and the ideal value for each of the circuit elements with the average differential value; and
   comparing each modified difference with the ideal value for the corresponding circuit element, and determining whether the modified difference lies within a defined tolerance corresponding to a satisfactory circuit element.

15. The process of claim 14 wherein the difference between the measured capacitance value and the ideal value is a percentage deviation of the measured capacitance value from the ideal value.

16. The process of claim 14 which further includes the step of calculating the average differential value as a running average.

17. The process of claim 14 which further includes the steps of identifying good circuit elements having modified differences which differ from the corresponding ideal values by no more than the defined tolerance, identifying bad circuit elements having modified differences which differ from the corresponding ideal values by more than the defined tolerance, and logging the bad circuit elements in a data file.

18. The process of claim 17 which further includes the steps of identifying good circuit elements having measured capacitance values which differ from the corresponding ideal values by no more than the defined tolerance, identifying bad circuit elements having measured capacitance values which differ from the corresponding ideal values by more than the defined tolerance, and logging the bad circuit elements in a temporary data file.

19. The process of claim 18 which further includes the step of counting the number of good circuit elements.

20. The process of claim 19 wherein the modifying step is performed only after the number of good circuit elements exceeds a defined threshold.

21. The process of claim 20 which further includes the steps of comparing the modified difference for a circuit element logged in the temporary data file with the ideal value for the corresponding circuit element, and determining whether the modified difference lies within the defined tolerance corresponding to a satisfactory circuit element after all of the circuit elements associated with the printed circuit have been tested.

22. An apparatus for identifying defective circuit elements present on a manufactured printed circuit, comprising:
   means for measuring a capacitance value for each of the circuit elements relative to a common reference point;
   means for comparing each measured capacitance value to an ideal value defined for and corresponding to each of the circuit elements;
   means for determining a difference between the measured capacitance value and the ideal value for each of the circuit elements, yielding a plurality of differential values for the circuit elements;
   means for averaging all of the differential values obtained for all of the circuit elements, yielding an average differential value;
   means for modifying the difference between the measured capacitance value and the ideal value for each of the circuit elements with the average differential value; and means for comparing each modified difference with the ideal value for the corresponding circuit element, and for determining whether the modified difference lies within a defined tolerance corresponding to a satisfactory circuit element.

23. The apparatus of claim 22 wherein the circuit elements include a plurality of networks comprising the printed circuit.

24. The apparatus of claim 22 wherein the means for determining the difference between the measured capacitance value and the ideal value includes means for calculating a percentage deviation of the measured capacitance value from the ideal value.

25. The apparatus of claim 22 which further includes means for calculating the average differential value as a running average.

26. The apparatus of claim 22 wherein the printed circuit includes good circuit elements having modified differences which differ from the corresponding ideal values by no more than the defined tolerance and bad circuit elements having modified differences which differ from the corresponding ideal values by more than the defined tolerance, and wherein the apparatus further includes a data file containing a log of the bad circuit elements.

27. The apparatus of claim 26 wherein the printed circuit includes good circuit elements having measured capacitance values which differ from the corresponding ideal values by no more than the defined tolerance and bad circuit elements having measured capacitance values which differ from the corresponding ideal values by more than the defined tolerance, and wherein the apparatus further includes a temporary data file containing a log of the bad circuit elements.

28. The apparatus of claim 27 which further includes a counter which counts the number of good circuit elements.

29. The apparatus of claim 28 wherein the counter is coupled with the modifying means so that the modifying means is enabled only after the number of good circuit elements exceeds a defined threshold.

30. The apparatus of claim 29 which further includes means for determining when all of the circuit elements associated with the printed circuit have been tested, and means responsive to the determining means for comparing the modified difference for a circuit element logged in the temporary data file with the ideal value for the corresponding circuit element, to determine whether the modified difference lies within the defined tolerance corresponding to a satisfactory circuit element.

* * * * *